United States Patent
Widiez et al.

(10) Patent No.: US 12,412,786 B2
(45) Date of Patent: Sep. 9, 2025

(54) METHOD FOR TRANSFERRING A LAYER FROM A SOURCE SUBSTRATE TO A DESTINATION SUBSTRATE

(71) Applicant: Commissariat à l'Énergie Atomique et aux Énergies Alternatives, Paris (FR)

(72) Inventors: Julie Widiez, Grenoble (FR); Frank Fournel, Grenoble (FR)

(73) Assignee: Commissariat à l'Énergie Atomique et aux Énergies Alternatives, Paris (FR)

(*) Notice: Subject to any disclaimer, the term of this patent is extended or adjusted under 35 U.S.C. 154(b) by 0 days.

(21) Appl. No.: 18/865,491

(22) PCT Filed: May 4, 2023

(86) PCT No.: PCT/EP2023/061793
§ 371 (c)(1),
(2) Date: Nov. 13, 2024

(87) PCT Pub. No.: WO2023/222399
PCT Pub. Date: Nov. 23, 2023

(65) Prior Publication Data
US 2025/0112093 A1 Apr. 3, 2025

(30) Foreign Application Priority Data
May 18, 2022 (FR) ...................................... 2204711

(51) Int. Cl.
*H01L 21/78* (2006.01)
*B32B 37/00* (2006.01)

(52) U.S. Cl.
CPC ........ *H01L 21/7813* (2013.01); *B32B 37/025* (2013.01); *B32B 2457/14* (2013.01)

(58) Field of Classification Search
CPC ............... H01L 21/7813; B32B 37/025; B32B 2457/14
(Continued)

(56) References Cited

U.S. PATENT DOCUMENTS

| | | | |
|---|---|---|---|
| 6,908,832 B2 | 6/2005 | Farrens et al. | |
| 8,753,468 B2 * | 6/2014 | Caldwell | C01B 32/23 156/289 |

(Continued)

FOREIGN PATENT DOCUMENTS

| | | |
|---|---|---|
| CN | 101213651 A | 7/2008 |
| CN | 101803002 A | 8/2010 |

(Continued)

OTHER PUBLICATIONS

International Search Report and Written Opinion for International Application No. PCT/EP2023/061793, mailed Sep. 5, 2023.
(Continued)

*Primary Examiner* — Vu A Vu
(74) *Attorney, Agent, or Firm* — Wolf, Greenfield & Sacks, P.C.

(57) ABSTRACT

A method of transferring a layer from a source substrate to a destination substrate, comprising the following steps: a) activating a bonding surface of said layer and a bonding surface of the destination substrate, by ion etching of said surfaces, or by sputtering of a bonding material onto said surfaces; and b) after step a), placing into contact the bonding surface of said layer with the bonding surface of the destination substrate, wherein, during step a), a masking ring covers a peripheral portion of the bonding surface of said layer, and/or a masking ring covers a peripheral portion of the bonding surface of the destination substrate; and wherein steps a) and b) are carried out under vacuum and with no rupture of vacuum between the two steps.

11 Claims, 5 Drawing Sheets

(58) Field of Classification Search
USPC .......................................................... 438/478
See application file for complete search history.

(56) References Cited

U.S. PATENT DOCUMENTS

| | | | | |
|---|---|---|---|---|
| 8,916,013 | B2 * | 12/2014 | Hong | B32B 37/025 |
| | | | | 156/239 |
| 9,844,757 | B2 * | 12/2017 | Sinton | B01D 67/0079 |
| 10,727,004 | B2 * | 7/2020 | Choi | H01L 21/28556 |
| 11,069,822 | B2 * | 7/2021 | Park | H10D 8/70 |
| 11,214,491 | B2 * | 1/2022 | Arliguie | B05D 1/005 |
| 11,504,959 | B2 * | 11/2022 | Quellmalz | H01L 21/02002 |
| 2016/0233125 | A1 | 8/2016 | Landru et al. | |
| 2022/0139768 | A1 | 5/2022 | Broekaart et al. | |
| 2023/0154755 | A1 | 5/2023 | Darras et al. | |

FOREIGN PATENT DOCUMENTS

| | | | |
|---|---|---|---|
| CN | 113380639 | A | 9/2021 |
| FR | 3 109 016 | A1 | 10/2021 |
| JP | 2020-038916 | A | 3/2020 |

OTHER PUBLICATIONS

Inoue et al., Edge Trimming Induced Defects on Direct Bonded Wafers. J. of Electronic Packaging, Sep. 2018;140:031004 (1-6).
Second Office Action for Chinese Application No. 202380036051.7, dated May 27, 2025.

* cited by examiner

METHOD FOR TRANSFERRING A LAYER FROM A SOURCE SUBSTRATE TO A DESTINATION SUBSTRATE

This application is a national stage filing under 35 U.S.C. § 371 of International Patent Application Serial No. PCT/EP2023/061793, filed May 4, 2023, which claims priority to, French patent application 2204711 filed on May 18, 2022 and entitled "Procédé de transfert d'une couche depuis un substrat source vers un substrat destination". The contents of these applications are incorporated herein by reference in their entirety.

TECHNICAL BACKGROUND

The present disclosure generally concerns methods of manufacturing microelectronic components based on semiconductor materials. It more particularly aims at a method of transferring a semiconductor layer from a source substrate to a destination substrate.

PRIOR ART

In microelectronic component manufacturing methods, transfers of layers are currently used to transfer a relatively thin semiconductor layer of high crystal quality, onto a thicker destination substrate of lower crystal quality or made of a less expensive material.

After the transfer, the transferred layer may be used as a base for an epitaxy step. Microelectronic components can then be formed inside and on top of the epitaxial layer.

It would be desirable to at least partly overcome certain disadvantages of known methods for transferring a semiconductor layer from a source substrate to a destination substrate.

The improvement of the quality of the edges of the transfer layer is here more particularly considered.

SUMMARY OF THE INVENTION

An embodiment provides a method of transferring a layer from a source substrate to a destination substrate, comprising the following steps:
  a) activating a bonding surface of said layer and a bonding surface of the destination substrate, by ion etching of said surfaces, or by sputtering of a bonding material onto said surfaces; and
  b) after step a), placing into contact the bonding surface of said layer with the bonding surface of the destination substrate,
  wherein, during step a), a masking ring covers a peripheral portion of the bonding surface of said layer, and/or a masking ring covers a peripheral portion of the bonding surface of the destination substrate; and
  wherein steps a) and b) are carried out under vacuum and with no rupture of vacuum between the two steps.

According to an embodiment, the destination substrate and/or the source substrate has tapered edges across a first width.

According to an embodiment, the masking ring has a width greater than or equal to the first width.

According to an embodiment, the method comprises, after step b), a step c) of removal of the source substrate.

According to an embodiment, step c) comprises an anneal step resulting in fracturing the assembly obtained at the end of step b), in the plane of an implanted buried layer separating said layer from the source substrate.

According to an embodiment, said layer is a semiconductor layer.

According to an embodiment, the method comprises, after step b), a step of epitaxy on top of and in contact with the surface of said layer opposite to the destination substrate.

According to an embodiment, the method comprises, before step a), a step of forming of a step at the periphery of said layer and/or at the periphery of the destination substrate.

According to an embodiment, said step is formed by ion etching, while protecting a central portion of the bonding surface by means of a masking disk.

According to an embodiment, the ion etching for forming said step is implemented in the same equipment as that used at step a) for the activation of the bonding surfaces.

According to an embodiment, the method comprises a waiting period of at least 10 minutes and/or a cycle of application of a reactive gas between the forming of said step and the activation of the bonding surfaces.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the methods of manufacturing microelectronic components based on the transferred semiconductor layers have not been detailed, the described transfer methods being compatible with all or most usual microelectronic component manufacturing methods.

In the following disclosure, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made, unless specified otherwise, to the orientation of the figures.

Unless specified otherwise, the expressions "around", "approximately", "substantially" and "in the order of" signify within 10%, and preferably within 5%.

FIG. 1A, FIG. 1B, FIG. 1C, FIG. 1D, and FIG. 1E are perspective views, partially and schematically illustrating successive steps of an example of a method of transferring a semiconductor layer from a source substrate to a destination substrate according to a first embodiment.

Figure 1A:
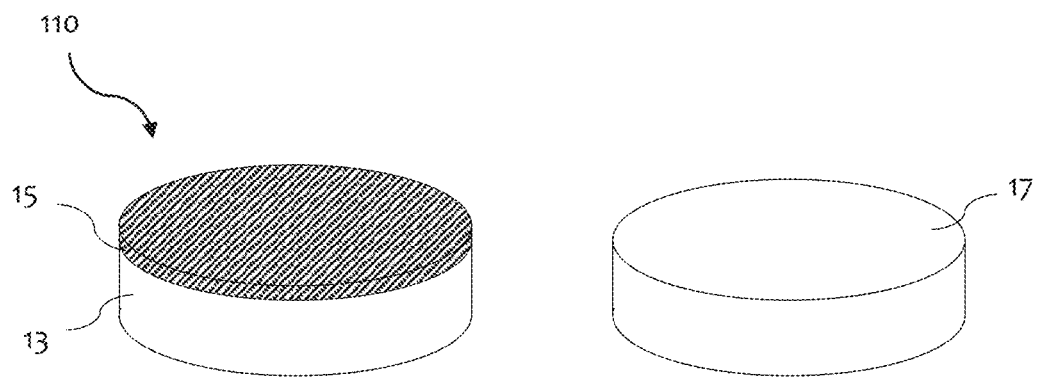
FIG. 1A, FIG. 1B, FIG. 1C, FIG. 1D, and FIG. 1E are perspective views, partially and schematically illustrating successive steps of an example of a method of transferring a semiconductor layer from a source substrate to a destination substrate according to a first embodiment.

FIG. 1A shows, in its left-hand portion, a structure 110 comprising a source substrate 13 and a semiconductor layer to be transferred 15 and, in its right-hand portion, a destination substrate 17.

The semiconductor layer to be transferred 15 is arranged on the upper surface of substrate 13 and for example in contact therewith. Semiconductor layer 15 for example continuously extends with a substantially uniform thickness across the entire upper surface of substrate 13. Semiconductor layer 15 is for example a single-crystal layer. As an example, semiconductor layer 15 is a layer of silicon carbide (SiC), for example, monocrystalline, for example, of 4H—SiC type. As a variant, semiconductor layer 15 is made of germanium (Ge), for example, monocrystalline. The described embodiments are not limited to these specific examples.

Source substrate 13 is for example made of a semiconductor material. As an example, source substrate 13 is made of the same material as semiconductor layer 15. The described embodiments are however not limited to this specific case.

The layer to be transferred 15 has, for example, a thickness in the range from 100 nm to 10 µm, for example, from 300 nm to 2 µm.

Source substrate 13 for example has a thickness in the range from 100 µm to 1 mm, for example, between 250 µm and 800 µm, for example, in the order of 350 µm.

Destination substrate 17 may be made of a semiconductor material or of a dielectric material. Destination substrate 17 is for example a semiconductor wafer, for example, made of silicon or of polysilicon carbide, for example, of 3C—SiC type.

As an example, destination substrate 17 and source substrate 13 have substantially the same shape and the same dimensions in top view. As an example, destination substrate 17 and source substrate 13 are both, in top view, of circular shape and have, for example, the same diameter.

To limit risks of breakage, destination substrate 17 and/or source substrate 13 preferably have tapered or rounded edges and a lip area, for example, across a peripheral ring-shaped strip having a width in the range from 0.1 mm to 5 mm, for example from 0.2 mm to 3 mm. In other words, destination substrate 17 and/or source substrate 13 have, at their periphery, a decreasing thickness as the distance to the center of the substrate increases, for example, across a peripheral ring-shaped strip having a width in the range from 0.1 mm to 5 mm, for example, from 0.2 to 3 mm.

During the transfer of the layer to be transferred 15 onto destination substrate 17, the layer to be transferred 15 is placed into contact, by its upper surface in the orientation of FIG. 1A, on the upper surface of destination substrate 17.

In practice, and more particularly in the case where destination substrate 17 and/or source substrate 13 have tapered edges, it can be observed that the bonding of layer 15 to destination substrate 17 is incomplete at the periphery of the assembly. Indeed, during the transfer of layer 15 onto substrate 17, while layer 15 and substrate 17 are well contacted to the center of the assembly, they are not or only partially so at the edge of the assembly, particularly due to the peripheral taper of the substrates, and/or to possible surface unevennesses of the substrates.

At the end of a step of removal of source substrate 13, the peripheral portions of layer 15 which are not bonded or poorly bonded to destination substrate 17 break off. Thus, a peripheral ring-shaped strip of destination substrate 17 is not covered or only partially covered with layer 15.

In the absence of specific precautions, after the transfer, the edges of layer 15 at the periphery of the assembly are irregular. This is due to the fact that the bonding limit between layer 15 and destination substrate 17 is irregular. This irregularity of the edges of layer 15 may cause defects likely to propagate towards the center of layer 15 during subsequent microelectronic component manufacturing steps, for example, during a step of epitaxy from the upper surface of layer 15. The defects are in particular likely to propagate in the epitaxial layer on layer 15.

It is here desired to improve the regularity or sharpness of the edges of layer 15 at the end of the transfer.

Figure 1B:
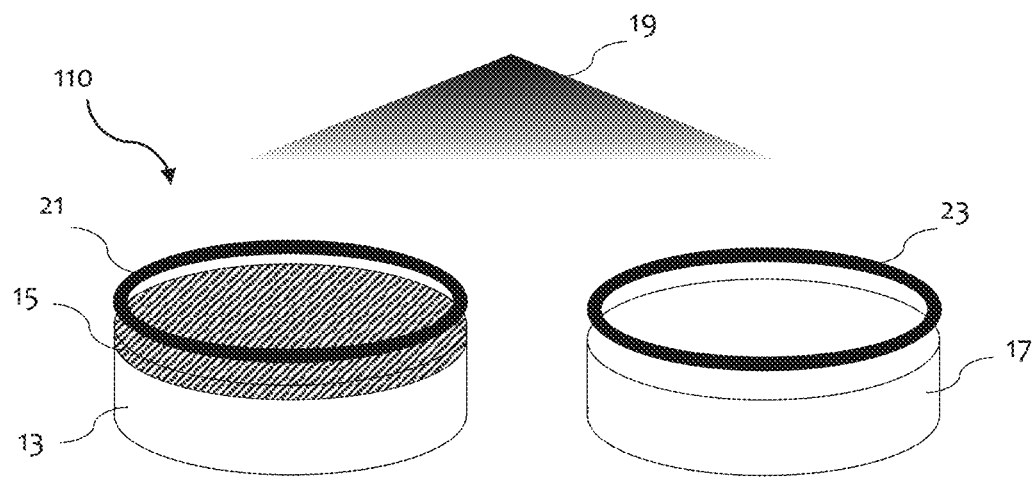

FIG. 1B illustrates a step of activation of the upper surface, called bonding surface, of layer 15 and of the upper surface, called bonding surface, of destination substrate 17.

This activation step is implemented by an etching or ion abrasion method comprising sending onto the surfaces to be activated a beam of ions 19 or of or atoms, for example, neutral. Beam 19 enables to remove, for example, the oxides that may be present at the surface of the surfaces to be activated and to form dangling bonds which will be used to form covalent bonds during the placing into contact, at a subsequent step, of the activated surfaces. Such a bonding method is generally called surface activated bonding or SAB.

This step is carried out under vacuum, that is, at a pressure lower than the atmospheric pressure, for example, under ultra-high vacuum, for example, under a pressure lower than $10^{-7}$ mbar, for example, lower than $10^{-8}$ mbar.

In the example of FIG. 1B, during the step of activation of the bonding surfaces, a masking ring 21 covers a peripheral portion of the bonding surface of layer 15, and a masking ring 23 covers a peripheral portion of the bonding surface of destination substrate 17. As an example, masking ring 21 has an external diameter corresponding to the diameter of source substrate 13. Masking ring 23 for example has an external diameter corresponding to the diameter of destination substrate 17. As an example, in vertical projection, the center of masking ring 21 coincides with the center of source substrate 13, and the center of masking ring 23 coincides with the center of destination substrate 17. The width of the peripheral ring-shaped strip of layer 15 masked with ring 21 is for example in the range from 0.2 mm to 5.1 mm, for example from 0.3 mm to 3.1 mm, for example, in the order of 0.5 mm. The width of the peripheral ring-shaped strip of destination substrate 17 masked with ring 23 is for example in the range from 0.2 mm to 5.1 mm, for example from 0.3 mm to 3.1 mm, for example, in the order of 0.5 mm. As an example, masking rings 21 and 23 are identical, to within manufacturing dispersions.

Masking rings 21 and 23 are for example metallic and/or made of a semiconductor or insulating material. As an example, during the step of activation of the bonding surfaces by ion etching, ring 21 is arranged on top of and in contact with the bonding surface of semiconductor layer 15, and ring 23 is arranged on top of and in contact with the bonding surface of destination substrate 17.

In the shown example, the activation of the bonding surface of layer 15 and the activation of the bonding surface of destination substrate 17 are simultaneously performed. As a variant, the activation of the bonding surface of layer 15 and the activation of the bonding surface of destination substrate 17 are performed successively, with no rupture of vacuum.

During the activation step, only the free portions of the bonding surfaces of destination substrate 17 and of the layer to be transferred 15, that is, the portions of the bonding surfaces of layer 15 and of substrate 17 which are not covered with masking rings 21 and 23, are activated. In particular, the surface dangling bonds intended to subsequently form covalent bonds to bond layer 15 onto destination substrate 17 are only formed in the central portions, not covered with masking rings 21 and 23, of the bonding surfaces of layer 15 and of destination substrate 17. The activation, and particularly the forming of dangling bonds, however does not occur in the peripheral portions, covered with masking rings 21 and 23, of the bonding surfaces of layer 15 and of destination substrate 17.

Figure 1C:
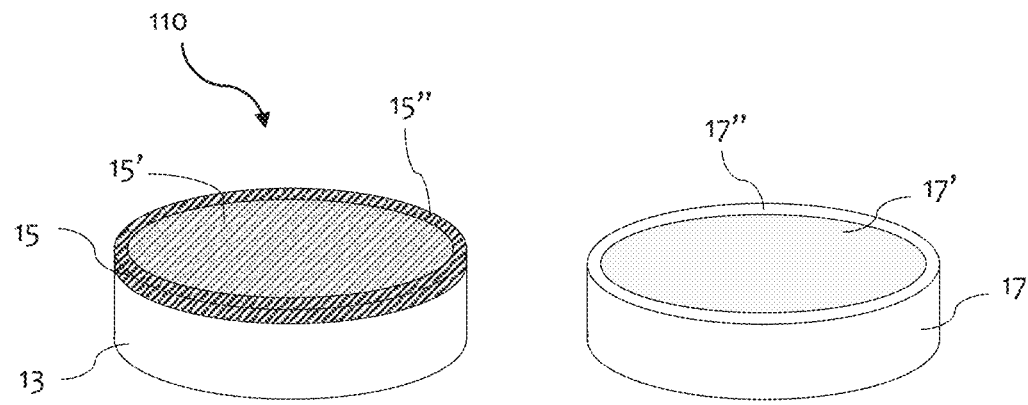

FIG. 1C illustrates structure 110 and destination substrate 17 at the end of the step of activation of the bonding surfaces of destination substrate 17 and of layer 15 and after the removal of masking rings 21 and 23.

At this stage, a central portion 15' of the bonding surface of layer 15 is activated and a central portion 17' of the bonding surface of destination substrate 17 is activated. A peripheral portion 15" of the bonding surface of layer 15 and a peripheral portion 17" of the bonding surface of destination substrate 17 however remain inactivated and comprise no dangling bonds allowing the creation of covalent bonds.

Figure 1D:
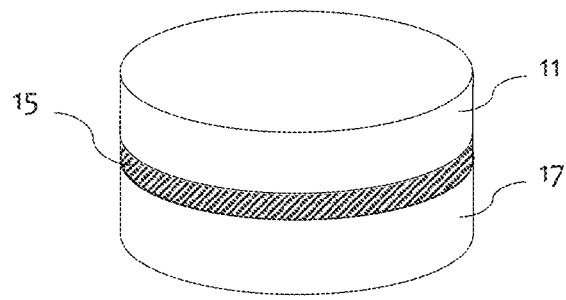

FIG. 1D illustrates a step of bonding of the structure 110 of FIG. 1C onto the destination substrate 17 of FIG. 1C. During this step, the bonding surface of layer 15 is placed in contact with the bonding surface of destination substrate 17.

The dangling bonds formed on the activated portion 15' of the bonding layer of layer 15 and the dangling bonds formed on the activated portion of 17' of the bonding surface of substrate 17 create, when they are placed into contact, covalent bonds ensuring the bonding of layer 15 onto substrate 17.

As an example, the bonding step is performed under a temperature in the range from 10° C. to 400° C., for example, from 10° C. to 40° C., for example, at room temperature.

Figure 1E:
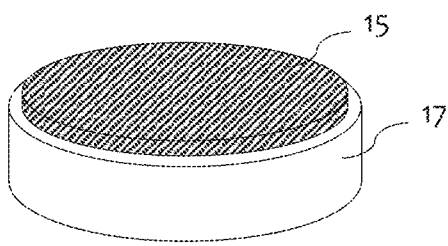

FIG. 1E illustrates the structure obtained at the end of a step of removal of source substrate 13 to only keep the layer 15 to be transferred on the bonding surface of destination substrate 17.

As an example, substrate 13 is made of the same semiconductor material as layer 15, and a buried layer (not visible in the drawings) implanted, for example with hydrogen ions (H+), separates layer 15 from source substrate 13. As an example, structure 110 is initially a single-crystal semiconductor wafer, which is implanted from its upper surface, for example, with hydrogen ions, to create the buried implanted layer separating the layer 15 to be transferred from source substrate 13. As an example, the removal of source substrate 13 may comprise a step of thermal anneal resulting in fracturing structure 110 in the plane of the buried implanted layer, to enable to remove source substrate 13 and to only keep layer 15 on destination substrate 17.

More generally, the removal of substrate 13 may be performed by any other known method of removal of a source substrate during a transfer of a semiconductor layer from a source substrate to a destination substrate, for example, by grinding, or by a laser lift off method.

During the removal of source substrate 13, only the central area of layer 15 located in front of the activated portion 15' of the bonding surface remains bonded to the activated portion 17' of the bonding surface of destination substrate 17. The peripheral portion 17", not activated, of the bonding surface of destination substrate 17 however remains free, that is, not covered with layer 15.

Thus, at the end of the method illustrated in FIGS. 1A to 1E, the transferred layer 15 has a sharp and regular edge substantially corresponding to the inner edge of masking ring 21 installed during the activation step of FIG. 1B.

The surface activation and bonding steps are carried out with no rupture of vacuum. As an example, the steps of surface activation (FIG. 1B) and bonding (FIG. 1D) are carried out within the same equipment, for example comprising an activation chamber where the activation step of FIG. 1B is implemented, and a bonding chamber where the bonding step of FIG. 1D is implemented.

In practice, during the bonding step (FIG. 1D), it is desired to align the structures to have the activated surfaces 15' of layer 15 and 17' of substrate 17 coincide. However, even if the alignment is not perfect, the provided solution enables to obtain a sharp edge of the transferred layer, since only the portions of activated surfaces 15' and 17' placed in contact adhere to each other.

It should be noted that in the example illustrated in FIG. 1B, the bonding surface of layer 15 is activated through a masking ring 21 and the bonding surface of destination substrate 17 is activated through a masking ring 23. As a variant, a masking ring may be provided on the bonding surface of layer 15 only or on the bonding surface of destination substrate 17 only. In this case, during the placing into contact of the bonding surfaces, the bonding of layer 15 to semiconductor substrate 17 does not take place at the periphery of the assembly, since the dangling bonds will only have been formed on one of the two bonding surfaces. An advantage of this variant is that it requires a lower alignment accuracy.

FIG. 2A, FIG. 2B, FIG. 2C, FIG. 2D, and FIG. 2E are cross-section views, partially and schematically illustrating successive steps of an example of a method of transferring a semiconductor layer from a source substrate to a destination substrate according to a second embodiment.

The second embodiment is similar to the first embodiment illustrated in FIGS. 1A to 1E, with the difference that, in the second embodiment, the activation of the bonding surfaces is performed by deposition of a thin layer of a bonding material providing dangling bonds then enabling to form covalent bonds during the placing into contact of the active surfaces. The elements common with the method of FIGS. 1A to 1E will not be detailed again hereafter. Only the differences with the method of FIGS. 1A to 1E will be highlighted.

Figure 2A:
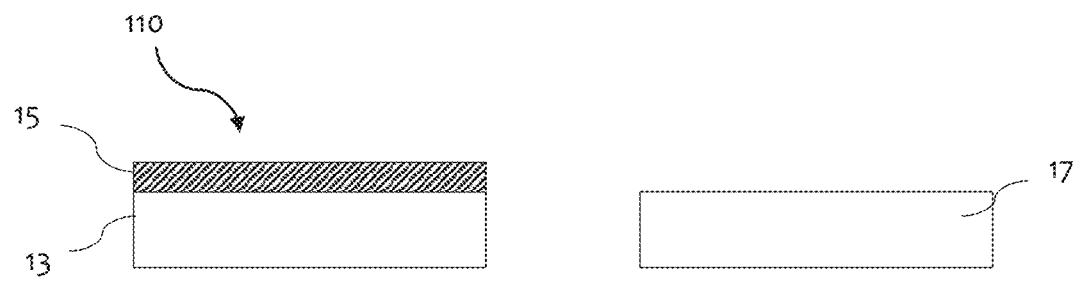
FIG. 2A, FIG. 2B, FIG. 2C, FIG. 2D, and FIG. 2E are cross-section views, partially and schematically illustrating successive steps of an example of a method of transferring a semiconductor layer from a source substrate to a destination substrate according to a second embodiment.

FIG. 2A illustrates, similarly to FIG. 1A, in its left-hand portion, the structure 110 comprising source substrate 13 and the semiconductor layer to be transferred 15 and, in its right-hand portion, destination substrate 17.

Figure 2B:
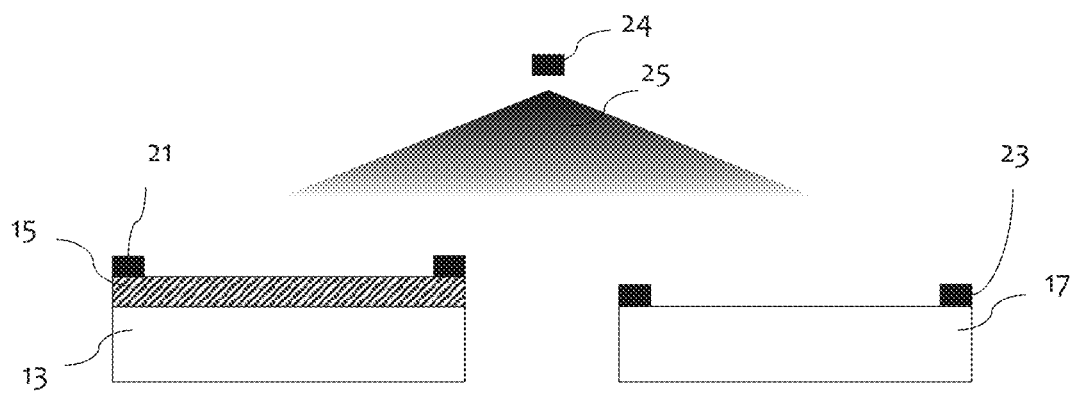

FIG. 2B illustrates a step of activation of the upper surface, called bonding surface, of layer 15 and of the upper surface, called bonding surface, of destination substrate 17.

This activation step comprises depositing a thin activation layer on the surfaces to be activated. This enables to create dangling bonds which will be used to form covalent bonds during the placing into contact of the activated layers in a subsequent step. This bonding technique is called atomic diffusion bonding or ADB.

As an example, during this step, a beam of ions or atoms, for example of neutral gas, for example of argon, bombards a target 24 made of a material having its atoms 25 detach and uniformly deposit in a thin layer on the surface(s) to be activated. As an example, the target is metallic, for example, made of tungsten or of titanium. As a variant, target 24 is made of a semiconductor material, for example, of silicon, of germanium, etc.

This step is carried out under vacuum, that is, at a pressure lower than the atmospheric pressure, for example, under ultra-high vacuum, for example, under a pressure lower than $10^{-7}$ mbar, for example, lower than $10^{-8}$ mbar.

Similarly to what has been previously described, during the activation, a masking ring 21 covers the bonding surface of layer 15 and a masking ring 23 covers the bonding surface of destination substrate 17.

In the shown example, the activation of the bonding surface of layer 15 and the activation of the bonding surface of destination substrate 17 are simultaneously performed. As a variant, the activation of the bonding surface of layer 15 and the activation of the bonding surface of destination surface 17 are performed successively with no rupture of vacuum.

Similarly to whet has been previously described, during the activation step, only the free portions of the bonding surfaces of destination substrate 17 and of layer 15, that is, the portions of the bonding surfaces of layer 15 and of substrate 17 which are not covered with masking rings 21 and 23, are activated.

Figure 2C:
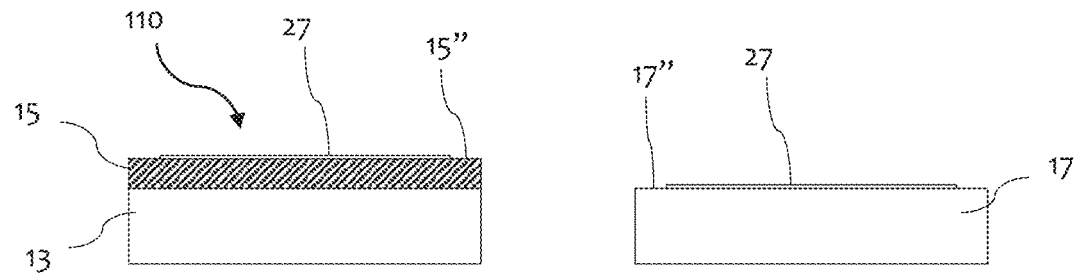

FIG. 2C illustrates structure 110 and destination substrate 17 at the end of the step of activation of the bonding surfaces of destination substrate 17 and of layer 15 and after the removal of masking rings 21 and 23.

At this stage, a central portion of the bonding surface of layer 15 and a central portion of the bonding surface of destination substrate 17 are active, that is, topped with a layer 27 made of the material of target 24. As an example, layers 27 each have a thickness greater than 0.2 nm, for example, lower than 100 nm. As an example, layer(s) 27 have a thickness in the range from 1 nm to 20 nm.

In this example, the periphery 15" of the bonding surface of layer 15 and the periphery 17" of the bonding surface of destination substrate 17 are not activated, that is, they are not covered with layer 27, and accordingly comprise no dangling bonds allowing the creation of covalent bonds to bond layer 15 to substrate 17.

Figure 2D:
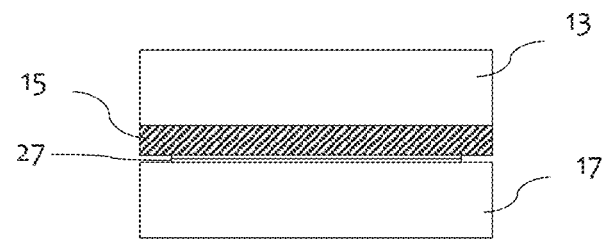

FIG. 2D illustrates a step of bonding of the structure 110 of FIG. 2C onto the destination substrate 17 of FIG. 2C. During this step, the bonding surface of layer 15 is placed into contact with the bonding surface of destination substrate 17. More particularly, the layer 27 formed on layer 15 and the layer 27 formed on destination substrate 17 are placed into contact.

The dangling bonds of the layer 27 deposited on layer 15 and those of the layer 27 deposited on substrate 17 create, when they are placed into contact, covalent bonds ensuring the bonding of layer 15 to substrate 17.

As an example, the bonding step is carried out under a temperature in the range from 10° C. to 400° C., for example, in the range from 10° C. to 40° C., for example, at room temperature.

As an example, the interface resistivity between layer 15 and destination substrate 17 is lower than $10^{-3}$ $\Omega \cdot cm^{-2}$, for example, lower than $10^{-5}$ $\Omega \cdot cm^{-2}$. This enables the bonding to be electrically transparent.

Figure 2E:
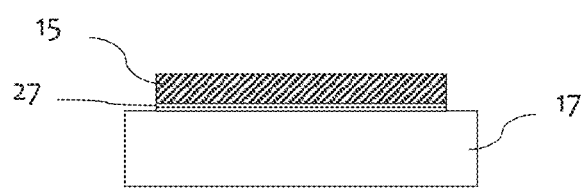

FIG. 2E illustrates the structure obtained at the end of a step of removal of source substrate 13 from the structure illustrated in FIG. 2D.

As previously, during the removal of source substrate 13, only the central area of the layer 15 to be transferred located in front of the activated portions of the bonding surfaces remains bonded to destination substrate 17. The peripheral portion 17" of destination substrate 17, located in front of the non-activated portions of the bonding surfaces however remains free, that is, non-covered with layer 15.

Here again, the steps of bonding surface activation (FIG. 2B) and bonding (FIG. 2D) are carried out with no rupture of vacuum, for example within the same equipment, for example comprising an activation chamber where the activation step of FIG. 2B is implemented, and a bonding chamber where the bonding step of FIG. 2D is implemented.

In the example illustrated in FIG. 2B, the bonding surface of layer 15 is activated through a masking ring 21 and the bonding surface of destination substrate 17 is activated through a masking ring 23. As a variant, a masking ring may be provided on the bonding surface of layer 15 only or on the bonding surface of destination substrate 17 only. In this case, during the placing into contact of the bonding surfaces, the bonding of layer 15 to destination substrate 17 does not take place at the periphery of the assembly, since the dangling bonds will only have been formed on one of the two bonding surfaces.

In practice, during the bonding step, the structures are desired to be aligned in such a way as to have the activated surfaces of the two structures coincide. However, even if the alignment is not perfect, the provided solution enables to obtain a sharp edge of the transferred layer, since only the portions of the activated surfaces placed into contact adhere to each other.

FIG. 3A, FIG. 3B, FIG. 3C, FIG. 3D, FIG. 3E, and FIG. 3F are cross-section views, partially and schematically illustrating successive steps of an example of a method of transferring a semiconductor layer from a source substrate 13 to a destination substrate 17 according to a third embodiment.

The third embodiment is similar to the first embodiment illustrated in FIGS. 1A to 1E, with the difference that it comprises a step of etching of a step on the periphery of destination substrate 17 and on the periphery of layer 15 before the step of bonding of layer 15 onto substrate 17. The elements common with the method of FIGS. 1A to 1E will not be detailed again hereafter. Only the differences with the method of FIGS. 1A to 1E will be highlighted.

Figure 3A:
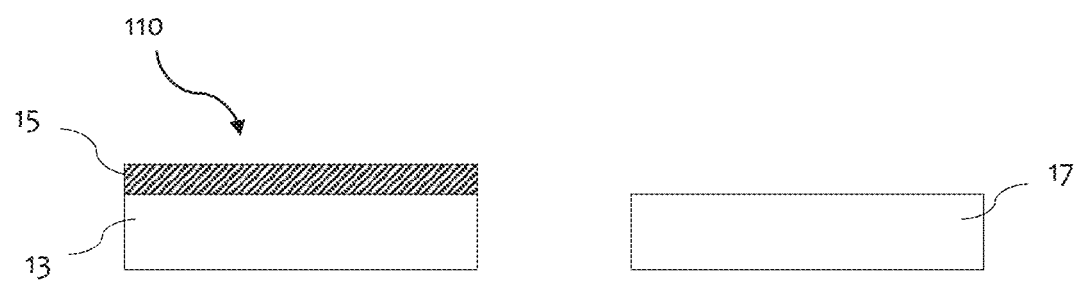
FIG. 3A, FIG. 3B, FIG. 3C, FIG. 3D, FIG. 3E, and FIG. 3F are cross-section views, partially and schematically illustrating successive steps of an example of a method of transfer of a semiconductor layer from a source substrate to a destination substrate according to a third embodiment.

FIG. 3A illustrates, similarly to FIG. 1A, in its left-hand portion, the structure 110 comprising source substrate 13 and the semiconductor layer 15 to be transferred and, in its right-hand portion, destination substrate 17.

Figure 3B:
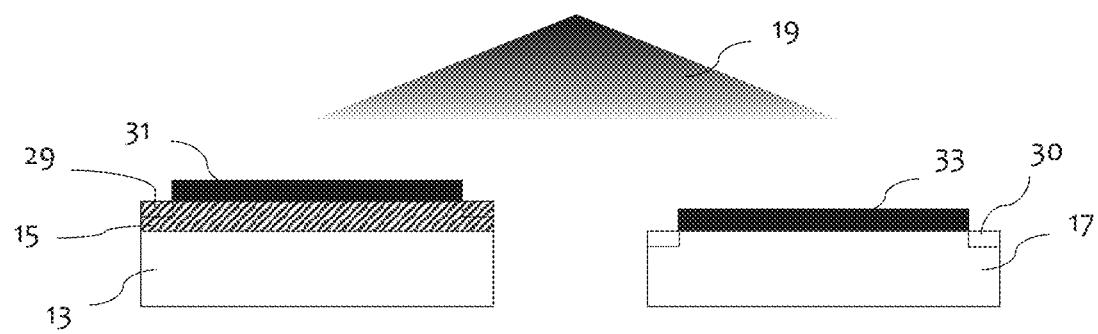

FIG. 3B illustrates a step of etching of a step 30, on the periphery of the upper surface of destination substrate 17 and of a step 29 on the periphery of the upper surface of layer 15.

Steps 29 and 30 are carried out by an etching or ion abrasion method comprising sending onto the areas to be etched a beam of ions 19 or of atoms, for example, neutral. This step is carried out under vacuum, that is, at a pressure lower than the atmospheric pressure, for example, under ultra-high vacuum, for example, under a pressure lower than $10^{-7}$ mbar, for example, lower than $10^{-8}$ mbar.

During the etch step, only the free portions of the upper surfaces of destination substrate 17 and of layer 15, that is, the portions of the upper surface of layer 15 and of destination substrate 17 which are not covered with a mask, are etched.

In the example of FIG. 3B, to form a step 29 on the periphery of the bonding surface of layer 15 only and a step 30 on the periphery of the bonding surface of destination substrate 17 only, the central portions of the bonding surfaces are each covered with a masking disk. Thus, during the etch step, a masking disk 31 covers a central portion of the bonding surface of layer 15 and a masking disk 33 covers a central portion of the bonding surface of destination substrate 17.

As an example, in vertical projection, the center of masking disk 31 coincides with the center of source substrate 13, and the center of mask disk 33 coincides with the center of destination substrate 17. As an example, the diameter of masking disk 31 is smaller than the diameter of source substrate 13 and the diameter of masking disk 33 is smaller than the diameter of destination substrate 17. The difference between the diameter of source substrate 13 and the diameter of masking disk 31 is, for example, in the range from 0.2 mm to 5 mm, for example from 0.5 mm to 3 mm, for example in the order of 1 mm. The difference between the diameter of destination substrate 17 and the diameter of masking disk 33 is, for example, in the range from 0.2 mm to 5 mm, for example, from 0.5 mm to 3 mm, for example, in the order of 1 mm. As an example, masking disks 31 and 33 are identical, to within manufacturing dispersions.

Masking disks 31 and 33 are for example metallic and/or made of a semiconductor or insulator material. As an example, during the step of etching of steps 29 and 30, masking disk 31 is arranged on top of and in contact with the upper surface of semiconductor layer 15, and masking disk 33 is arranged on top of and in contact with the upper surface of destination substrate 17.

In the shown example, the etching of step 29 in layer 15 and the etching of step 30 in destination substrate 17 are performed simultaneously. As a variant, the etching of step 29 in layer 15 and the etching of step 30 in destination substrate 17 are performed successively.

As an example, step 29 has a depth, from the upper surface of layer 15, greater than approximately 10 nm, for example greater than approximately 50 nm. As an example, step 30 has a depth, from the upper surface of substrate 17, greater than approximately 10 nm, for example, greater than approximately 50 nm. As an example, due to the different nature of layer 15 and of substrate 17, step 29 and step 30 do not have the same depth.

At the end of this step, masking disks 31 and 33 are removed.

Figure 3C:
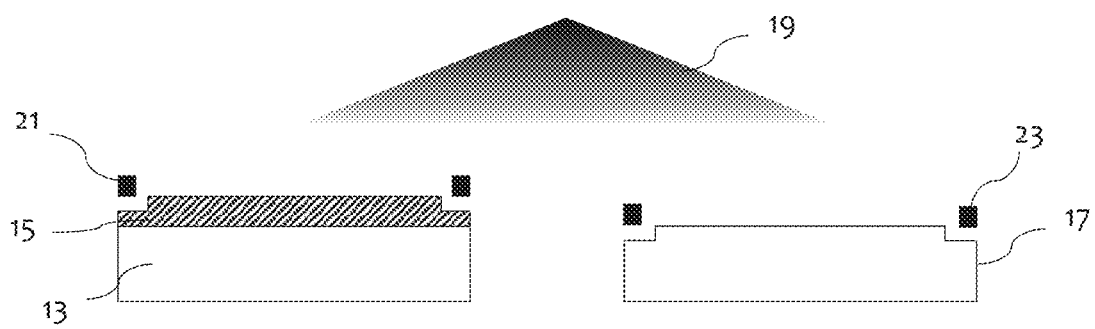

FIG. 3C illustrates a step of activation of the bonding surfaces of layer 15 and of destination substrate 17.

The method implemented during this step is an etching or ion abrasion method similar to the method implemented during the forming of steps 29 and 30. The etching energy and/or the etching time are however lower than the etching energy and/or the etching time implemented during the forming of steps 29 and 30 to activate the exposed surfaces without etching a significant thickness of layer 15 and of substrate 17. During this step, the beam of ions 19 or of atoms, for example, neutral, sent onto the surfaces to be activated enables to remove, for example, possible oxides present at the surface of the surfaces to be activated while leaving dangling bonding which will be used to form covalent bonds during the placing into contact of the activated surfaces in a subsequent step. As an example, during this step, the removal of material from the surfaces to be activated is smaller than a few nanometers, for example smaller than 5 nm. In any case, the thickness of material removed during this activation step is smaller than the thickness removed during the forming of steps 29 and 30.

As an example, during the step illustrated in FIG. 3C, the surface exposure time is for example decreased and/or the power of ion beam 19 is for example decreased with respect to the step illustrated in FIG. 3B.

Similarly to what has been previously described in relation with FIG. 1B, during the activation, a masking ring 21 covers the bonding surface of layer 15 and a masking ring 23 covers the bonding surface of destination substrate 17.

In the shown example, the activation of the bonding surface of layer 15 and the activation of the bonding substrate of destination layer 17 are performed simultaneously. The activation of the bonding surface of layer 15 and the activation of the bonding surface of destination surface 17 are successively performed with no rupture of vacuum.

Similarly to what has been previously described, during the activation step, only the free portions of the bonding surfaces of destination substrate 17 and of layer 15, that is, the portions of the bonding surfaces of layer 15 and of substrate 17 which are not covered with a masking ring 21, are activated.

As an example, masking disk 21 has an inner diameter greater than or equal to the diameter of disk 31. Similarly, masking disk 23 has an inner diameter greater than or equal to the diameter of disk 33. Thus, layer 15 comprises a free portion in step 29 and substrate 17 comprises a free portion in step 30. These free portions in steps 29 and 30 are then activated during this step.

As an example, the step of etching of steps 29 and 30 (FIG. 3B) and the step of activation of the bonding surfaces through the masking rings (FIG. 3C) are separated by a few minutes, for example, at least fifteen minutes, to decrease the activation of the ring etched at the step of FIG. 3B. This waiting period may be implemented with no rupture of vacuum between the two steps. As a variant, this waiting period may be replaced with a cycle of placing back the chamber, or a portion of the chamber, for example, with the use of a load port, at a higher pressure, for example at the atmospheric pressure, for example, under an atmosphere containing a reactive gas such as nitrogen or oxygen. Here again, this enables to decrease the activation of the etched ring, that is, to neutralize dangling bonds at the surface of the etched ring.

Figure 3D:
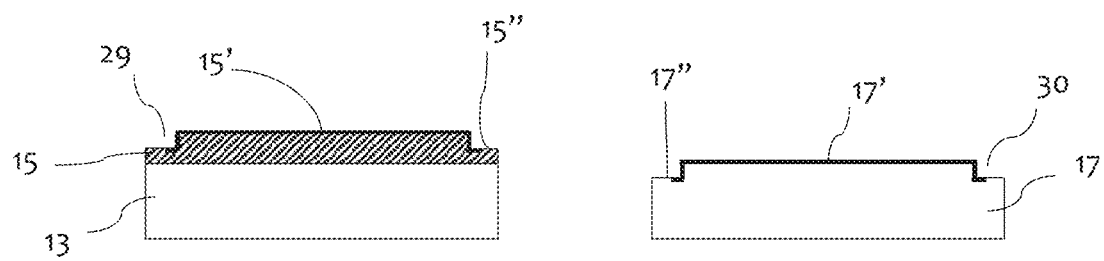

FIG. 3D illustrates structure 110 and destination substrate 17 at the end of the step of activation of the upper surfaces of destination substrate 17 and of layer 15 and after the removal of masking rings 21 and 23.

At this stage, a central portion 15' of the bonding surface of layer 15 which further extends in step 29 and a central portion 17' of the bonding surface of destination substrate 17 which further extends in step 30 are activated. A peripheral portion 15" of the bonding surface of layer 15 and a peripheral portion 17" of the bonding surface of destination substrate 17 however remain inactive and comprise no dangling bonds allowing the creation of covalent bonds. As an example, peripheral portions 15" and 17" are respectively located in steps 29 and 30. As an example, peripheral portion 15" extends across a width smaller than the width of step 29 and similarly, peripheral portion 17" extends, for example, across a width smaller than the width of step 30.

Figure 3E:
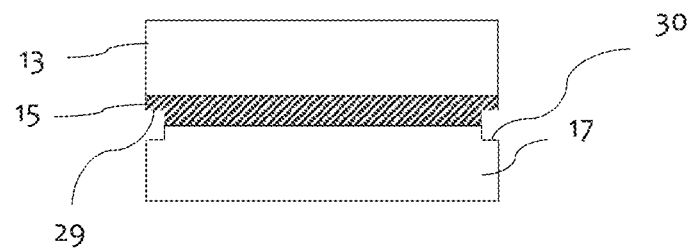

FIG. 3E illustrates a step of bonding of structure 110 to destination substrate 17. During this step, the bonding surface of layer 15 is placed into contact with the bonding surface of destination substrate 17. Unlike the bonding step illustrated in FIG. 1D, in FIG. 3E, only a central area of the bonding surface of layer 15, delimited by step 29 is placed into contact with a central area of the bonding surface of substrate 17, delimited by step 30.

The dangling bonds formed on the activated portion 15' of the bonding surface of layer 15 and the dangling bonds formed on the activated portion of 17' of the bonding surface of substrate 17 create, when they are placed into contact, covalent bonds ensuring the bonding of layer 15 to substrate 17.

As an example, the bonding step is performed under a temperature in the range from 10° C. to 400° C., for example, from 10° C. to 40° C., for example, at ambient temperature.

Figure 3F:
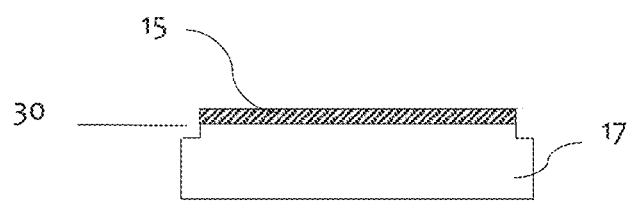

FIG. 3F illustrates the structure obtained at the end of a step of removal of source substrate 13 from the structure illustrated in FIG. 3E.

During the removal of source substrate 13, only the central area of the layer 15 to be transferred located in front of the activated portions of the bonding surfaces and outside of steps 29 and 31 remains bonded to destination substrate 17. The peripheral portion of destination substrate 17 located in front of steps 29 and 30 however remain free, that is, not covered with layer 15.

Here again, the steps of activation of the bonding surfaces (FIG. 3C) and of bonding (FIG. 3E) are carried out with no rupture of vacuum, for example, within the same equipment, for example comprising an activation chamber where the etch step of FIG. 3B and the activation step of activation of FIG. 3C are implemented, and a bonding chamber where the bonding step of FIG. 3E is implemented.

In the example illustrated in FIG. 3B, the etching of layer 15 is performed through masking disk 31 to form a step 29 in layer 15 and the etching of destination substrate 17 is performed through a masking disk 33 to form a step 30 in destination substrate 17. As a variant, a masking disk may be provided on layer 15 only or on destination substrate 17 only to form a step on a single one of the two bonding surfaces.

Further, in the example illustrated in FIG. 3C, the bonding surface of layer 15 is activated through a masking ring 21 and the bonding surface of destination substrate 17 is activated through a masking ring 23. As a variant, a masking ring may be provided on the bonding surface of layer 15 only or on the bonding surface of destination substrate 17 only. In this case, during the placing into contact of the bonding surfaces, the bonding of layer 15 onto destination substrate 17 does not take place at the periphery of the assembly, since the dangling bonds will only have been formed on one of the two bonding surfaces.

An advantage of the method of FIGS. 3A to 3F is that the etching of steps 29 and/or 30 enables to improve the sharpness of the limit between the bonded central area and the non-bonded peripheral area of layer 15. Due to the delimitation of the bonding surfaces by masking rings 21 and/or 23, steps 29 and/or 30 may however be relatively shallow, for example, with a depth smaller than 500 nm and preferably smaller than 100 nm.

A more detailed example of implementation of the method of FIGS. 2A to 2E will now be described. In this example, it is provided to transfer a single-crystal layer of 4H—SiC of a source substrate of 4H—SiC onto a destination substrate corresponding to a polycristalline 3C—SiC wafer. In this example, a buried layer is implanted in a 4H—SiC wafer with hydrogen ions, the buried layer delimiting the layer to be transferred onto the destination substrate. The implantation step is for example carried out with a dose in the order of $5.10^{16}$ at/cm² and an energy in the order of 95 keV. Still in this example, after the implantation step, the 4H—SiC wafer and the 3C—SiC wafer are submitted to a cleaning step enabling to remove surface contaminants. After the cleaning step, the two wafers are introduced into a deposition chamber of the ADB equipment where they each see their upper surface coated with a silicon film deposited through a ring-shaped mask masking its peripheral portion across a width in the order of 1 mm. In this example, the ring-shaped mask is made of molten silica. This step is carried out at ambient temperature under ultra-high vacuum corresponding to a pressure in the order of $10^{-6}$ Pa (that is, $10^{-8}$ mbar). At the end of this step, each of the two 4H—SiC and 3C—SiC wafers has its upper surface covered with a silicon film having a thickness greater than 1 nm and smaller than 20 nm across its entire upper surface, excluding a ring having a width in the order of 1 mm at the edge of the wafer. With no rupture of vacuum and in another bonding chamber, the two wafers are bonded by taking care of placing into contact the silicon films formed on each of the two 4H—SiC and 3C—SiC wafers. The bonded assembly is then submitted to a thermal treatment to cause a fracture, in the 4H—SiC wafer, between the layer to be transferred and the source substrate at the level of the buried layer and thus remove the source substrate. The thermal treatment is for example carried out at approximately 900° C. for approximately 30 minutes. Polishing and/or cleaning steps may be provided before submitting the structure formed by the destination substrate and by the layer to be transferred to a new anneal in the order of 1,700° C. for approximately 30 minutes.

A more detailed example of implementation of the method of FIGS. 3A to 3F will now be described. In this example, it is provided to transfer a germanium film from a source substrate corresponding to a germanium wafer onto a destination substrate corresponding to a silicon wafer. In this example, a buried layer is implanted in the germanium wafer with hydrogen ions, the buried layer delimiting the layer to be transferred of the destination substrate The implantation step is carried out with a dose in the order of $5.5.10^{16}$ at/cm² and an energy of approximately 100 keV. Still in this example, after the implantation step, the silicon wafer and the germanium wafer are introduced into an activation chamber of the SAB equipment under ultra-high vacuum (that is, lower than $10^{-7}$ mbar) where their upper surfaces are etched, each through a disk, made of silicon, having a diameter smaller by approximately 3 mm, than the wafer diameter. The etching is performed while the wafers are rotating, for example with a speed in the order of 70 rpm. The etching is performed under an argon flow having an energy in the order of 200 eV with an intensity in the order of 150 mA for approximately 10 minutes. At the end of the etch step, the two wafers pass into a load port where the pressure rises up to 500 mbars due to a nitrogen flow before decreasing back under ultra-high vacuum due to a purge with an argon flow at 500 mbars. The wafers then return into the activation chamber under ultra-high vacuum. The upper surfaces of the two wafers are then each activated, through a ring-shaped mask, made of silicon, masking its peripheral portion across a width in the order of 2.5 mm, with argon atoms having an energy of approximately 200 eV and an intensity in the order of 150 mA and this, for one minute. With no rupture of vacuum and in another bonding chamber, the two wafers are bonded by taking care of placing into contact the activated surfaces of each of the two germanium and silicon wafers. The bonding step is carried out under a temperature of approximately 250° C. under ultra-high vacuum. The bonded assembly is then submitted to a thermal treatment to cause a fracture, in the germanium wafer, between the layer to be transferred and the source substrate at the level of the buried layer and thus remove the source substrate. The thermal treatment is for example performed at approximately 330° C. for approximately 10 hours. In this example, a germanium film of approximately 800 nm is transferred onto the silicon.

Various embodiments and variants have been described. Those skilled in the art will understand that certain features of these various embodiments and variants may be combined, and other variants will occur to those skilled in the art. In particular, the described embodiments are not limited to the examples of materials and of dimensions mentioned in the present disclosure.

Further, the embodiments of FIGS. 2A to 2E and 3A to 3F may be combined. More precisely, the activation of the surfaces during the step illustrated in FIG. 3C may be performed according to the activation method described in relation with FIG. 2B.

Further, the embodiments have been described for circular source and destination substrate, however they may have a different shape.

Further, although the provided methods are advantageous for the transfer of a semiconductor layer from a source substrate to a destination substrate, they may also be implemented to transfer layers of different natures such as metal layer or dielectric layers from a source substrate to a destination substrate.

Further, in the described embodiments, the masking ring may be replaced with a frame or an ovoid ring. Further, the edges of the masking ring may be corrugated and not have the shape of a circle.

Finally, the practical implementation of the described embodiments and variations is within the abilities of those skilled in the art based on the functional indications given hereabove.

The invention claimed is:

1. A method of transferring a layer from a source substrate to a destination substrate, comprising the following steps:
   a) activating a bonding surface of said layer and a bonding surface of the destination substrate, by ion etching of said surfaces, or by sputtering of a bonding material onto said surfaces; and
   b) after step a), placing into contact the bonding surface of said layer with the bonding surface of the destination substrate,
   wherein, during step a), at least one of:
      a first masking ring covers a peripheral portion of the bonding surface of said layer; and
      a second masking ring covers a peripheral portion of the bonding surface of the destination substrate,
   and wherein steps a) and b) are carried out under vacuum and with no rupture of vacuum between the two steps.

2. The method according to claim 1, wherein at least one of the destination substrate and the source substrate has tapered edges across a first width.

3. The method according to claim 2, wherein said at least one of the first and second masking ring has a width greater than or equal to the first width.

4. The method according to claim 1, comprising, after step b), a step c) of removal of the source substrate.

5. The method according to claim 4, wherein step c) comprises an anneal step resulting in fracturing the assembly obtained at step b), in the plane of an implanted buried layer separating said layer from the source substrate.

6. The method according to claim 1, wherein said layer is a semiconductor layer.

7. Method according to claim 6, comprising, after step b) and step c), a step of epitaxy on top of and in contact with the surface of said layer opposite to the destination substrate.

8. Method according to claim 1, comprising, before step a), a step of forming of a step at least one of:
   the periphery of said layer; and
   at the periphery of the destination substrate.

9. The method according to claim 8, wherein said step is formed by ion etching, by protecting a central portion of the bonding surface by means of a masking disk.

10. The method according to claim 9, wherein the ion etching for forming said step is implemented in a same equipment as that used at step a) for the activation of the bonding surfaces.

11. The method according to claim 10, comprising at least one of:
   a waiting period of at least 10 minutes; and
   a cycle of application of a reactive gas between the forming of said step and the activation of the bonding surfaces.

* * * * *